(12) United States Patent
Agarwal

(10) Patent No.: US 6,566,701 B2
(45) Date of Patent: May 20, 2003

(54) ENCAPSULATED CONDUCTIVE PILLAR

(75) Inventor: Vishnu Kumar Agarwal, Boise, ID (US)

(73) Assignee: Micron Technology, Inc., Boise, ID (US)

( * ) Notice: Subject to any disclaimer, the term of this patent is extended or adjusted under 35 U.S.C. 154(b) by 0 days.

(21) Appl. No.: 10/035,109

(22) Filed: Dec. 27, 2001

(65) Prior Publication Data

US 2002/0055234 A1 May 9, 2002

Related U.S. Application Data

(62) Division of application No. 09/645,776, filed on Aug. 25, 2000.

(51) Int. Cl.⁷ ............................................. H01L 27/108
(52) U.S. Cl. ...................... 257/306; 257/310; 257/532; 257/534; 438/250; 438/253; 438/393; 438/398
(58) Field of Search ................. 257/298, 300, 257/301, 302, 303, 306–313, 438; 438/239–242, 243–249, 250–256, 386–398

(56) References Cited

U.S. PATENT DOCUMENTS

| | | | |
|---|---|---|---|
| 4,549,927 A | 10/1985 | Goth et al. | |
| 4,866,008 A | 9/1989 | Brighton et al. | |
| 5,008,730 A | 4/1991 | Huang et al. | |
| 5,470,789 A | 11/1995 | Misawa | |
| 5,581,436 A | 12/1996 | Summerfelt et al. | |
| 6,034,389 A | 3/2000 | Burns, Jr. et al. | |
| 6,046,108 A | 4/2000 | Liu et al. | |
| 6,054,331 A | 4/2000 | Woo et al. | |
| 6,114,238 A | 9/2000 | Liao | |
| 6,114,243 A | 9/2000 | Gupta et al. | |
| 6,130,124 A | * 10/2000 | Lee | 438/240 |
| 6,168,991 B1 | * 1/2001 | Choi et al. | 438/254 |
| 6,274,499 B1 | 8/2001 | Gupta et al. | |
| 6,291,082 B1 | * 9/2001 | Lopatin | 428/621 |
| 6,320,213 B1 | * 11/2001 | Kirlin et al. | 257/295 |
| 6,342,444 B1 | 1/2002 | Higashi et al. | |

* cited by examiner

*Primary Examiner*—David Nelms
(74) *Attorney, Agent, or Firm*—Killworth, Gottman, Hagan & Schaeff LLP

(57) ABSTRACT

The present invention provides an encapsulated 3-D conductive pillar and a method of formation thereof. Significant economic savings are achieved by filling a substantial portion of the volume of the pillar with a lesser expensive conductive material. Additionally, the encapsulated 3-D conductor pillar forms a suitable unreactive, oxygen-stable electrode for use with high-dielectric constant (HDC) materials as the encapsulating barrier layer metal provides a stable conductive interface between the HDC material and the encapsulated conductive material.

18 Claims, 4 Drawing Sheets

ENCAPSULATED CONDUCTIVE PILLAR

CROSS REFERENCE TO RELATED APPLICATIONS

This application is a division of U.S. patent application Ser. No. 09/645,776 filed Aug. 25, 2000.

The invention generally relates to microelectronic structures, and more particularly, to an encapsulated three dimensional (3-D) conductive pillar suitable for use with high-dielectric constant materials and a method of formation thereof.

BACKGROUND OF THE INVENTION

Recent efforts for increasing capacitor density on an electronic substrate have focused on using high dielectric constant (HDC) materials as the capacitor dielectric. Currently the most promising dielectrics are perovskites, a family of HDC materials recognized for their excellent charge storage properties. However, with some of these HDC materials (e.g. $Ta_2O_5$, $TiO_2$ and $(Ba,Sr)TiO3$ (BST), a good barrier layer with effective diffusion and reaction barrier properties are required since traditional microelectronic electrodes react adversely to such materials, reducing their beneficial properties.

Accordingly, it is recognized in the industry that an oxygen stable electrode is required for use with such HDC materials. Exotic materials such as noble metals (Pt, Rh) have been considered as the non-reactive electrode material. However, extravagant use of such materials as an electrode material is prohibitive due to their cost. Additionally, at least a 1200 angstroms (Å) conductive layer is required in order to form a suitable 3-D conductive pillar of 0.46 microns by 0.23 microns. Specifically for Pt, depositing such a conductive layer takes upwards of 15 minutes per wafer due to its very slow deposition rate using conventional deposition techniques. Such a long processing time per wafer is undesirable due to the increase in production expenses.

Accordingly, there is a need for a 3-D conductive pillar which is both suitable as an oxygen stable electrode for use with a HDC material and economical to produce.

SUMMARY OF THE INVENTION

The present invention provides an encapsulated 3-D conductive pillar and a method of formation thereof. Significant economic savings in material costs and production run times are achieved by filling a substantial portion of the volume of the pillar with a less expensive material which can be deposited at a higher depositing rate. Additionally, the 3-D conductive pillar forms a suitable unreactive, oxygen-stable electrode for use with HDC materials as the encasing barrier layer metal provides a stable conductive interface between the HDC material and the encapsulated conductive material.

In accordance with one aspect of the invention provided in a first embodiment is a microelectronic structure comprising a substrate layer, a thin barrier layer metal on the substrate layer, and a conductive material encapsulated by the thin barrier layer metal. Provided in a second embodiment is a microelectronic capacitor comprising an insulating substrate layer having a conductive plug. The microelectronic capacitor further includes a thin barrier layer metal on the insulating substrate layer over the conductive plug, a conductive material encapsulated by the thin barrier layer metal, a dielectric layer provided over the barrier layer metal, and a top electrode layer provided over the dielectric layer. Provided in a third embodiment is a memory device having a microelectronic structure, the microelectronic structure comprising a substrate layer, a thin barrier layer metal on the substrate layer, and a conductive material encapsulated by the thin barrier layer metal. Provided in a fourth embodiment is a memory device having a capacitor, the capacitor comprising an insulating substrate layer having a conductive plug, a thin barrier layer metal on the insulating substrate layer over the conductive plug, a conductive material encapsulated by the thin barrier layer metal, a dielectric layer provided over the barrier layer metal, and a top electrode layer provided over the dielectric layer. Provided in a fifth embodiment is a computer system, the computer system includes a microelectronic device, the device comprises a substrate layer, a thin barrier layer metal on the substrate layer, and a conductive material encapsulated by the thin barrier layer metal. Provided in a sixth embodiment is a computer system, the computer system includes a microelectronic device, the device comprises an insulating substrate layer having a conductive plug, a thin barrier layer metal on the insulating substrate layer over the conductive plug, a conductive material encapsulated by the thin barrier layer metal, a dielectric layer provided over the barrier layer metal, and a top electrode layer provided over the dielectric layer.

In accordance with a second aspect of the present invention provided is a method of forming an encapsulated microelectronic structure suitable for use with a high-dielectric constant material. The method comprises providing a substrate layer, forming a container having a bottom and sidewalls from the substrate layer, and depositing a thin first layer of a barrier layer metal on the substrate layer covering at least the bottom and sidewall of the container. The method further comprises depositing a conductive material on the barrier layer metal substantially completely filling the container, depositing a thin second layer of the barrier layer metal on the conductive material to encapsulate the conductive material in the container, and planarizing the thin second layer of the barrier layer metal.

In accordance with the second aspect of the present invention provided is another method of forming an encapsulated microelectronic structure suitable for use with a high-dielectric constant material. The method comprises providing a substrate layer having a surface, forming a container having a bottom and sidewall from the substrate layer, and depositing a thin first layer of a barrier layer metal covering the bottom and sidewall of the container and the surface of the substrate. The method further includes depositing a conductive material covering the first layer of a barrier layer metal and completely filling the container, removing a portion of the conductive material to expose an upper portion of the barrier layer metal provided on the sidewall of the filled container, depositing a thin second layer of the barrier layer metal encapsulating the conductive material in the container, and planarizing the thin second layer of the barrier layer metal.

In accordance with the second aspect of the present invention provided is method of forming a capacitor having an encapsulated high-dielectric constant material. The method comprises providing a substrate layer having a conductive plug, and forming a container having a bottom and sidewall from the substrate layer, in which the conductive plug is located at the bottom of the container. The method further includes depositing a thin first layer of a barrier layer metal covering the bottom and sidewall of the container in which the conductive plug contacts the first layer of the barrier layer metal, depositing a conductive material substantially completely filling the container, and depositing a thin second layer of the barrier layer metal encapsulating the conductive material in the container. The method further includes planarizing the thin second layer of the barrier layer metal, forming a layer of a high-dielectric constant material over the conductive material, and, forming a top electrode over the high-dielectric constant material.

Other objects, features and advantages will appear more fully in the course of the following discussion.

BRIEF DESCRIPTION OF THE DRAWINGS

The same reference numerals refer to the same parts through the various figure embodiments.

DESCRIPTION OF THE INVENTION

Figure 1:
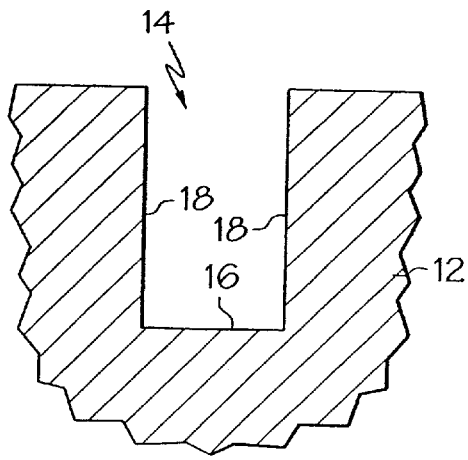
FIGS. 1–7 are cross-sectional views of a microelectronic structure according to an embodiment of the present invention in progressive steps of the fabrication of the same.

The process steps and structures described below do not form a complete process flow for manufacturing integrated circuits. The present invention can be practiced in conjunction with integrated circuit fabrication techniques currently used in the art, and only so much of the commonly practiced process steps are included as are necessary for an understanding of the present invention. The figures representing cross-sections of portions of an integrated circuit during fabrication are not drawn to scale, but instead are drawn so as to illustrate pertinent features of the invention.

Referring to FIGS. 1–7, the fabrication of an encapsulated 3-D conductor pillar 10 (FIG. 7) on a selected portion of a substrate 12 is described in progressive steps. It should be understood that the term "substrate" is often used ambiguously in the art of integrated circuits. Often, the term "substrate" is used to refer to the underlying substrate of silicon, gallium arsenide or other semiconductive materials on which an integrated circuit is fabricated. Additionally, the term "substrate" can also be used to refer to the incomplete portion or immediate layer of the integrated circuit on which a particular layer is formed. In this specification, the term "substrate" is used broadly to mean any layer on which a particular layer of interest is formed. Accordingly, the substrate layer may be any one selected from the group consisting of single component semiconductor materials, compound semiconductor materials, ceramic single crystals, ceramic poly-cystals, metals, and amorphous/glassy materials Furthermore, when functioning as an insulating layer, the material of the substrate 12 is one selected from the group consisting of $SiO_2$, $Si_3N_4$, BSG, PSG, BPSG, MgO, CaO, $CaF_2$, $Al_2O_3$ or $B_2O_3$. In the embodiments described below the substrate 12 is BPSG. Moreover, as used herein, it should be understood that the term "on" refers to forming a material layer in contact with either the entire or a portion of the underlying substrate, and "over" refers to forming a material layer above either the entire or a portion of the underlying substrate. Continuing, formed into an upper surface of the substrate 12 is a container 14 having a bottom 16 and sidewall 18.

Figure 2:
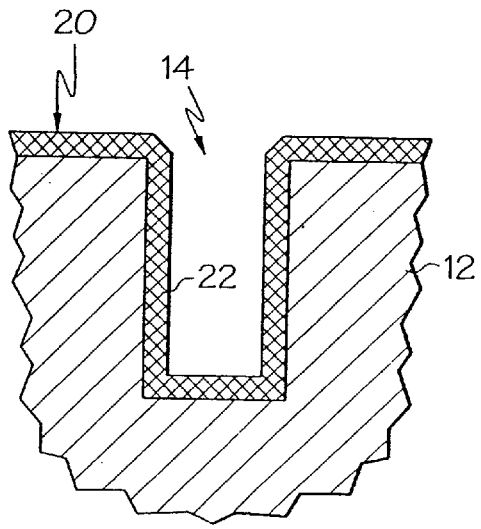

Referring now to FIG. 2, on substrate 12 deposited is a thin film 20 of a barrier layer metal 22. The term "thin" refers to a deposit layer of preferably up to about 200 Å. The barrier layer metal 22 is one selected from the group consisting of platinum, palladium, ruthenium, indium, rhodium, osmium, silver, and gold, their oxides (e.g. $RuO_2$, $IrO_2$, $Rh_2O_3$, $OsO_2$, and $PdO_2$) and any metal which is effective as a barrier layer to prevent interdiffusion of silicon atoms and metal/conductor atoms. The thin film 20 of the barrier layer metal 22 is deposited on the substrate 12, uniformly covering the bottom 16 and sidewall 18 of the container 14 as illustrated. Preferably, chemical vapor deposition (CVD) or sputtering techniques are utilized. Additionally, the substrate 12 may be heated to provide better stability.

Figure 3:
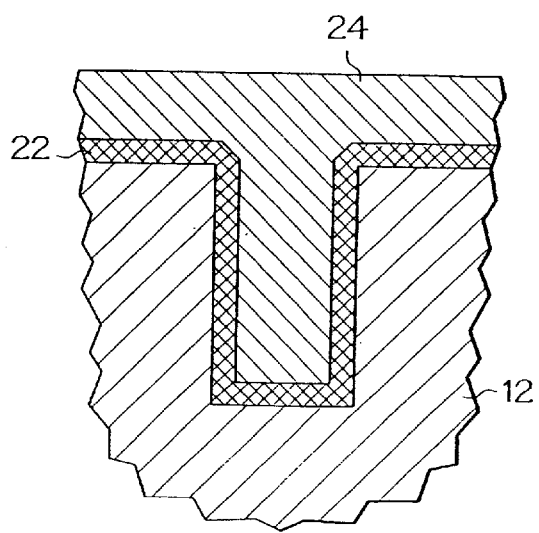

Now turning to FIG. 3, the barrier layer metal 22 is blanketed with a conductive material 24. The conductive material is deposited preferably by plasma enhanced chemical vapor deposition Or ion deposition sputtering, in order to substantially completely fill the container 14. The term "substantially completely fill" refers to the characteristic of a feature, such as a container, trench or via, which is filled substantially, if not completely with a conductive material. The conductive material 24 is one selected from the group consisting of tungsten (W), tungsten silicide ($WSi_x$), ruthenium (Ru), ruthenium oxide (RuOx), and silicon nitride ($Si_3N_4$).

Figure 4:
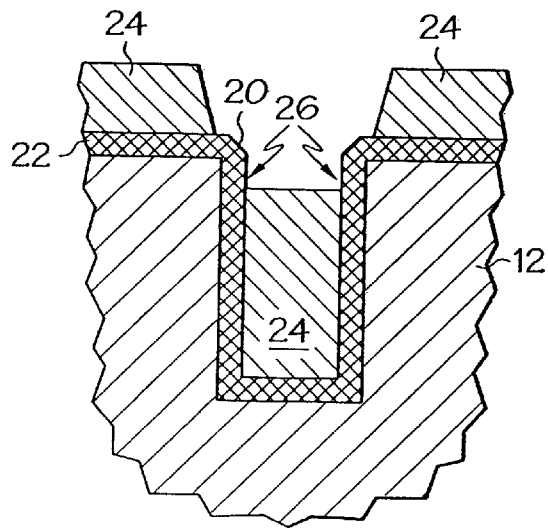

As illustrated in FIG. 4, after depositing the conductive material 24 an in situ, highly directional cleaning is performed. The conductive material 24 is cleaned with a fluorinated product, such as $NF_3$ clearing away an upper portion 26 of the filled container 14 and exposing the barrier layer 20 that surrounds the opening of the filled container. Additionally, the upper portion 26 extends a predetermined depth into the filled container 14.

Figure 5:
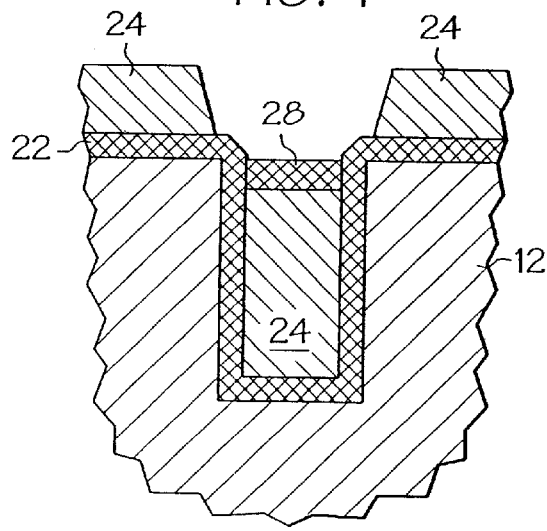
Figure 6:
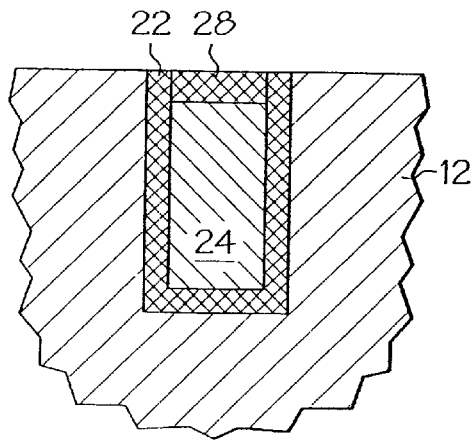

As shown in FIG. 5, a second layer 28 of the barrier layer metal 22 is deposited in the upper portion 26 of the filled container 14 thereby encapsulating the conductive material 24 in the barrier layer metal 22. In this step, the second layer 28 of the barrier layer metal 22 is preferably deposited by CVD or sputtering to a thickness of preferably about 200 Å.

Figure 7:
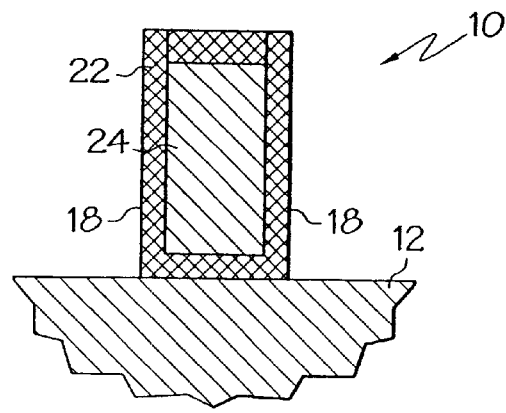

To reveal the pillar 10 as shown in FIG. 7, the material surrounding the encapsulating barrier layer metal 22 of the conductive material 24 must be removed. To remove these materials, the barrier layer metal 22 provided in the upper portion 26 of the container 14 is planarized by any conventional planarizing technique including Chemical Mechanical Planarization (CMP), thereby forming the microelectronic structure illustrated by FIG. 6. Next, anisotropic etching is utilized to remove the remaining materials thereby exposing the sidewall 18 of the pillar 10 as illustrated in PIG. 7. It should be appreciated that the above described microelectronic structure is useful as a bottom electrode in a microelectronic capacitor. The steps to complete a microelectronic capacitor with the above described pillar 10 are described with reference to FIGS. 8 and 9.

Figure 8:
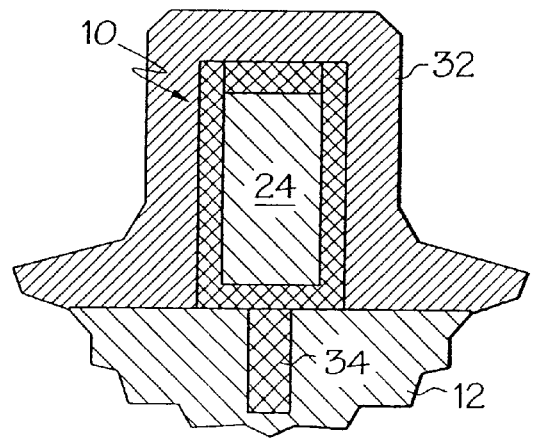
FIGS. 8–9 are cross-sectional views of a microelectronic capacitor according to another embodiment of the present invention in progressive steps of the fabrication of the same.

In FIG. 8, a dielectric layer 32 is formed over the pillar 10. Since the pillar 10 is serving as the bottom electrode in an integrated circuit, typically a conductive plug 34 is provided at the bottom of the container 14 by any suitable conventional method before depositing the barrier layer metal 22 in the processes steps described above. The conductive plug is a material selected from the group consisting of TiN, zirconium nitride titanium silicide, tantalum silicide, tungsten silicide, molybdenum silicide, nickel silicide, cobalt silicide, tantalum carbide, tantalum boride, polysilicon, germanium, W, Ta, Ti, Mo, TiW, boron carbide, and Cu and the like. As known, the conductive plug 34 contacts other contact areas, such as a source/drain, provided in another substrate layer. Dielectric layer 32 is a high dielectric constant dielectric, typically having a dielectric constant greater than 50, wherein the exact nature of this layer will depend upon the application. An example of high dielectric constant material typically used is selected from the group consisting of perovskites such as barium-strontium titanate (BST), $Ta_2O_5$, $TiO_2$, ferroelectrics such as $Pb(Zr,Ti)O_3$, $(Pb,La)(Zr,Ti)O_3$, Nb doped PZT, doped PZT, $Bi_4Ti_3O_{12}$, $SrBi_2(Ta,Nb)_2O_9$, pyroelectrics, and high dielectric constant oxides. Dielectric layer 32 may extend over the entirety of the area of the substrate 12 thereby simplifying the process of fabricating the integrated circuit, since a mask and a sequence of patterning steps may be omitted. Alternatively, if the layer 32 is specifically patterned, the patterning is done in an area of the integrated circuit which is surrounded by insulator and in which no critical parts are located, and thus it can be done with much greater tolerances, which also simplifies the overall process.

A heat treatment is performed at an elevated temperature of about 400° C. to about 900° C. for about 1 minute to 3 hours, wherein the treatment preferably includes rapid thermal anneal (RTA) and/or furnace anneal.

Figure 9:
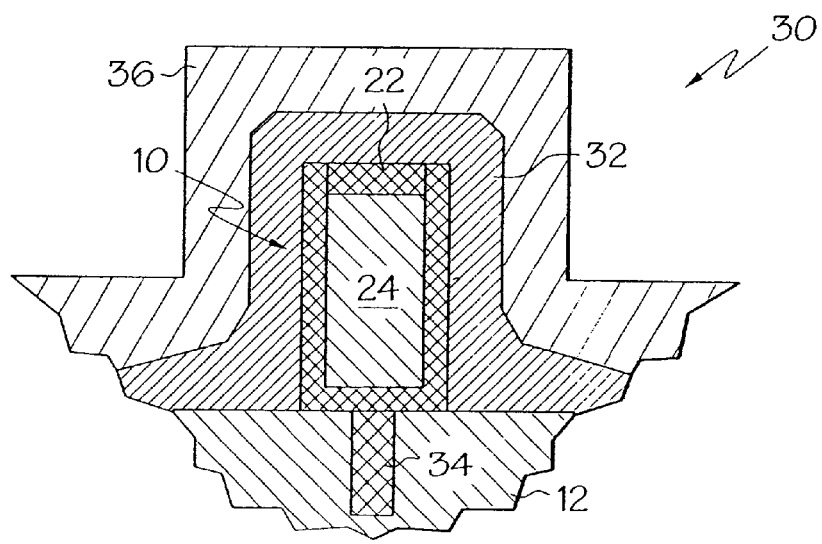

Next, as illustrated by FIG. 9, a top electrode layer 36 is formed, preferably by sputtering over the dielectric layer 32 to complete the microelectronic capacitor. The top electrode layer is preferably platinum, or any other conventionally used material. Additional conventional layers may then be deposited over the top electrode layer 36, such as a protective layer of tantalum, hafnium, tungsten, niobium and zirconium as is known. It should be appreciated that the dielectric layer 32 sandwiched between electrodes 10 and 36 together form an electronic component which changes its electronic state during operation in a completed integrated circuit. This is in contrast to other dielectric layers, such as an interlayer dielectric, which does not change its electronic state during the operation of the integrated circuit. Furthermore, although FIG. 8 shows the use of the pillar 10 as a bottom electrode in the microelectronic capacitor 30, the technique of encapsulating a conductive material as illustrated in FIGS. 1–5, can be used with a conductor line as well. For example, copper or silver encapsulated in Al or Ta, or Ti, and the like. It is to be appreciated that the microelectronic structure formed by the illustrative processes of FIGS. 1–7 may be used in a computer system as part of its memory device or as part of its integrated circuitry. Additionally, the microelectronic capacitor formed by the illustrated processes of FIGS. 1–9, may be used in a computer system as part of its memory device or its integrated circuitry.

Figure 10:
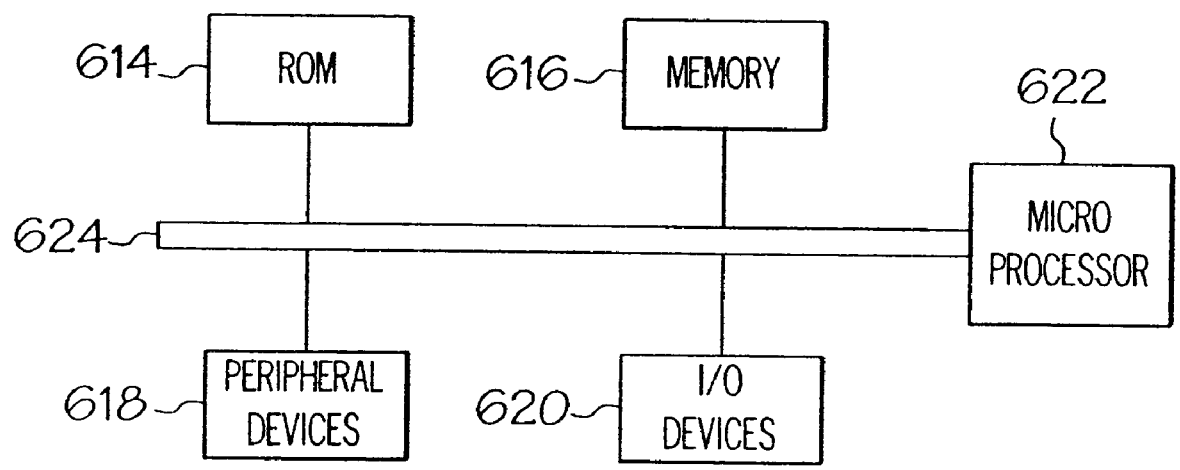
FIG. 10 is a computer system comprised of a number of microelectronic devices which may be fabricated with the embodiments of the present invention.

FIG. 10 is an illustration of a computer system 612 that can use and be used with embodiments of the present invention. As will be appreciated by those skilled in the art, the computer system 612 has a number of microelectronic devices that include, for example, ROM 614, mass memory 616, peripheral devices, and I/O devices 620 in communication with a microprocessor 622 via a data bus 624 or another suitable data communication path. These devices can be fabricated according with the various embodiments of the present invention.

In a typical embodiment, the following ranges of layer thicknesses and sizes may be used. As will be appreciated by those persons skilled in the art, these numbers may be modified to suit various processing requirements. The size of the container thus has a width ranging from preferably about 1500 Å to about 2000 Å, and a height ranging from preferably about 2000 Å to about 30000 Å. Accordingly, the dielectric layer 32 has a thickness of preferably about 30 Å, and the top electrode layer a thickness of preferably about 500 Å.

Having thus described the present invention in detail and by reference to preferred embodiments thereof, it will be apparent that modifications and variations are possible without departing from the scope of the invention detailed in the appended claims.

What is claimed is:

1. A capacitor structure provided on a substrate layer comprising:
   a thin barrier layer metal on the substrate layer;
   a conductive material encapsulated by said thin barrier layer metal; and
   a high dielectric constant (HDC) material layer on said thin barrier layer metal, said thin barrier layer metal providing a stable conductive interface between said conductive material and said HDC material layer.

2. The capacitor structure of claim 1 wherein said substrate layer is selected from the group consisting of single component semiconductor materials, compound semiconductor materials, ceramic single crystals, ceramic polycrystals, metals, and amorphous/glassy materials.

3. The capacitor structure of claim 1 wherein said thin barrier layer metal is selected from a group consisting of platinum, palladium, ruthenium, iridium, rhodium, osmium, silver, gold, $RuO_2$, $IrO_2$, $Rh_2O_3$, $O_5O_2$, and $PdO_2$.

4. The capacitor structure of claim 1 wherein said conductive material is selected from a group consisting of W, $WSi_x$, Ru, RuOx, and $Si_3N_4$.

5. The capacitor structure of claim 1, wherein said thin barrier layer metal has a thickness up to about 200 Å.

6. The capacitor structure of claim 1, wherein said HDC material layer is a dielectric having a dielectric constant greater than 50.

7. The capacitor structure of claims 1, wherein said HDC material layer is selected from a group consisting of perovskites, pyroelectrics, ferroelectrics, and high dielectric constant oxides.

8. The capacitor structure of claim 1, wherein said HDC material layer comprises a dielectric selected from a group consisting of BST, $Ta_2O_5$, $TiO_2$, $Pb(Zr,Ti)O_3$, $(Pb,La)(Zr,Ti)O_3$, Nb doped PZT, doped PZT, $Bi_4Ti_3O_{12}$, and $SiBi_2(Ta,Nb)_2O_9$.

9. A microelectronic capacitor comprising:
   an insulating substrate layer having a conductive plug;
   a thin barrier layer metal on said insulating substrate layer over said conductive plug;
   a conductive material encapsulated by said thin barrier layer metal;
   a dielectric layer provided over said barrier layer metal; and
   a top electrode layer provided over said dielectric layer.

10. The microelectronic capacitor of claim 9, wherein said insulating substrate layer is selected from the group consisting of $SiO_2$, $Si_3N_4$, BSG, PSG, BPSG, MgO, CaO, $CaF_2$, $Al_2O_3$ and $B_2O_3$.

11. The microelectronic capacitor of claim 9, wherein said conductive plug is selected from the group consisting of TiN, zirconium nitride, titanium silicide, tantalum silicide, tungsten silicide, molybdenum silicide, nickel silicide, cobalt silicide, tantalum carbide, tantalum boride, polysilicon, germanium, W, Ta, Ti, Mo, TiW, boron carbide, and Cu.

12. The microelectronic capacitor of claim 9, wherein said thin barrier layer metal is selected from the group consisting of platinum, palladium, ruthenium, iridium, rhodium, osmium, silver, gold, $RuO_2$, $IrO_2$, $Rh_2O_3$, $OsO_2$, and $PdO_2$.

13. The microelectronic capacitor of claim 9, wherein said conductive material is selected from the group consisting of W, $WSi_x$, Ru, RuOx, and $Si_3N_4$.

14. The microelectronic capacitor of claim 9, wherein said top electrode layer is platinum.

15. The capacitor structure of claim 9, wherein said thin barrier layer metal has a thickness up to about 200 Å.

16. The capacitor structure of claim 9, wherein said dielectric layer comprises a dielectric having a dielectric constant greater than 50.

17. The capacitor structure of claim 9, wherein said dielectric layer comprises a dielectric selected from a group consisting of perovskites, pyroelectrics, ferroelectrics, and high dielectric constant oxides.

18. The capacitor structure of claims 9, wherein said dielectric layer comprises a dielectric selected from a group consisting of BST, $Ta_2O_5$, $TiO_2$, $Pb(Zr,Ti)O_3$, $(Pb,La)(Zr,Ti)O_3$, Nb doped PZT, doped PZT, $Bi_4Ti_3O_{12}$, and $SrBi_2(Ta,Nb)_2O_9$.

* * * * *

UNITED STATES PATENT AND TRADEMARK OFFICE
CERTIFICATE OF CORRECTION

PATENT NO.   : 6,566,701 B2
DATED        : May 20, 2003
INVENTOR(S)  : Vishnu Kumar Agarwal It is certified that error appears in the above-identified patent and that said Letters Patent is hereby corrected as shown below:

Column 1,
Line 49, "less expensive material" should be -- less expensive conductive material --;

Column 3,
Line 54, "rials Furthermore," should be -- rials. Furthermore, --;

Column 4,
Line 3, "indium," should be -- iridium, --;
Line 17, "deposition Or ion" should be -- deposition or ion --;
Line 50, "in PIG. 7." should be -- in FIG. 7. --;
Line 63, "nitride titanium" should be -- nitride, titanium --;

Column 6,
Line 27, "$O_5O_2$," should be -- $OsO_2$, --;
Line 36, "of claims 1," should be -- of claim 1, --;
Line 44, "$SiBi_2(Ta$," should be -- $SrBi_2(Ta$, --; and Column 8,
Line 5, "of claims 9," should be -- of claim 9, --.

Signed and Sealed this

Twelfth Day of August, 2003

JAMES E. ROGAN
*Director of the United States Patent and Trademark Office*